United States Patent [19]

Yamaura et al.

[11] Patent Number: 5,548,232

[45] Date of Patent: Aug. 20, 1996

[54] METHOD AND APPARATUS FOR DETECTING/STORING WAVEFORM PEAK VALUE

[75] Inventors: Akira Yamaura; Masami Hosono, both of Tokyo, Japan

[73] Assignee: Hitachi Denshi Kabushiki Kaisha, Tokyo, Japan

[21] Appl. No.: 327,878

[22] Filed: Oct. 24, 1994

[30] Foreign Application Priority Data

Oct. 25, 1993 [JP] Japan ................................. 5-266269

[51] Int. Cl.⁶ .................................................. H03K 5/153
[52] U.S. Cl. .................................................. 327/60; 327/58
[58] Field of Search .......................................... 327/58–60

[56] References Cited

U.S. PATENT DOCUMENTS 4,297,676 10/1981 Moriya et al. .......................... 327/58

FOREIGN PATENT DOCUMENTS 5847661 10/1983 Japan .
63-082034 4/1988 Japan .......................... 327/58
0362123 3/1991 Japan .

Primary Examiner—Maragaret Rose Wambach
Attorney, Agent, or Firm—Antonelli, Terry, Stout & Kraus

[57] ABSTRACT

A method and apparatus for detecting a peak value of a waveform signal continuously inputted during a predetermined time period. The method includes the steps of: sequentially sampling the waveform signal continuously inputted during the predetermined time period and converting respective sampled values into consecutive trains of digital data of n-bit (n is an integer of 2 or larger); dividing each train of the converted n-bit digital data at least into two groups and obtaining at least an upper sub-data set and a lower sub-data set; detecting an upper sub-data set having a peak value from all the upper sub-data sets corresponding to the waveform signal continuously inputted during the predetermined time period; detecting a lower sub-data set having a peak value from at least one lower sub-data set corresponding to at least one detected upper sub-data set having the peak value; and outputting digital data of the detected upper and lower sub-data sets, as digital data having a peak value of the waveform signal continuously inputted during the predetermined time period.

17 Claims, 5 Drawing Sheets

METHOD AND APPARATUS FOR DETECTING/STORING WAVEFORM PEAK VALUE

BACKGROUND OF THE INVENTION

1. Field of the Invention

The present invention relates to a method and apparatus for detecting (deriving)/storing a maximum and/or minimum value (peak value) of an input signal waveform suitable for use with a display device such as an oscilloscope.

2. Description of the Related Art

Oscilloscopes have been used for monitoring waveforms of various data, among other purposes. They are essential and useful for research and developments, manufacturing, and the like of electronic devices, but they have had one significant disadvantage in that they are unable to store signal waveforms. With the progress of digital technology, digital oscilloscopes have been developed allowing them to store signal waveforms. A waveform storing circuit digitally processes various types of analog input signals and stores processed digital data. A combination of a waveform storing circuit and a display, a computer, or the like allows stored waveforms to be observed or to be applied to other applications.

An analog input signal is sampled at high speed, and A/D converted into digital data. Maximum peak amplitudes (or maximum and minimum values) of the digital data in an optional time period are sequentially stored and displayed. In this manner, very high speed noises which are called glitches and are impossible to be detected by general sampling technology can be detected, envelopes can be measured, and aliasing can be detected. It is well known that peak values can be detected by detecting maximum or minimum values in a similar manner.

FIG. 1 is a block diagram of a circuit for detecting/storing a peak value of a waveform according to a related art. In this circuit, an analog input waveform signal is converted into digital data by an A/D converter. A maximum or minimum value detecting unit (hereinafter called a peak value detecting unit) detects a maximum or minimum value (hereinafter called a peak value) of the digital data and stores the peak value in a memory. In FIG. 1, only one of the maximum and minimum value detecting units is shown. In the following description, a maximum value detecting unit is used as a representative of the peak value detecting unit, and a maximum value is derived as the peak value. It is obvious that the same technology is applicable to detecting a minimum value.

Referring to FIG. 1, an analog input waveform signal is applied to an input terminal 50. The analog input waveform signal applied to the peak value detecting/storing circuit is sampled, and the sampled value is converted into digital data at a timing of a first clock signal 57 by an A/D converter 51. A comparator 52 compares a digital data input A (supplied from the A/D converter 51) with a digital data input B (supplied from a latch 54). An OR gate 53 outputs a signal (an enable signal for the latch 54) in accordance with a digital output signal from the comparator 52 and a second clock signal 58. The latch 54 latches the digital data signal from the A/D converter 51 at a timing of the first clock signal 57. A memory 55 stores a maximum value of digital data from the latch 54 at a timing of the second clock signal 58. The maximum value is output from an output terminal 56 of the peak value detecting/storing circuit.

In the circuit structure described above, the comparator 52, OR gate 53, and latch 54 constitute a maximum value detecting unit 59 (as described earlier, only one detecting unit is shown in FIG. 1. Both the maximum and minimum value detecting units are required for detecting and storing the maximum and minimum values).

Next, the operation of the peak value detecting/storing circuit according to the related art will be described. Referring to FIG. 1, an analog input waveform signal applied to the signal input terminal 50 of the circuit is supplied to the A/D converter 51 and converted into n-bit digital data at a timing of the first clock signal 57. The n-bit digital data is supplied to the latch circuit 54 and comparator 52 at its input A of the maximum value detecting unit 59.

The comparator 52 is supplied with the n-bit digital data from the A/D converter 51 at its input A and with n-bit digital data latched by the latch 54 at its other input B. Both n-bit digital data are compared by the comparator 52.

In the maximum value detecting unit 59, of the comparison results A>B and A<B, the comparator 52 outputs a signal to the OR gate 53 when the comparison result is A>B (if both the maximum and minimum values are to be detected, the maximum and minimum value detecting units are used, and one comparator supplies its output when the comparison result is A>B whereas the other comparator outputs a signal when the comparison result is A<B).

The OR gate 53 is supplied with an output from the comparator 52 and the second clock signal 58, and outputs an enable signal to the latch 54 at the timing of either an output from the comparator 53 for A>B or the second clock signal 58.

The latch 54 enabled by the enable signal supplied from the OR gate 53 latches the data from the A/D converter 51 and outputs the data at a timing of the first clock signal 57.

The memory 55 stores the digital data at a timing of the second clock signal 58, and the maximum value of digital data is output from the signal output terminal 56 when necessary.

A peak value detecting/storing circuit having the structure described above is shown, for example, in JP-A-58-47661, and a comparator having the structure described above is shown, for example, in JP-A-3-62123.

In the circuit for detecting/storing a waveform peak value according to the related art, however, n-bit digital data is fed back from the latch 54 to the comparator 52. This feedback delay time $t_{PD}$ adversely affects a peak value detecting speed. The delay time $t_{PD}$ depends on the operation speeds of these devices including the comparator and latch. Therefore, there is a limit in improving the peak value detecting speed. In order to improve the peak value detecting speed, it becomes necessary to use expensive high speed devices. If the number of data bits increases, the number of comparison data bits increases, inevitably increasing the delay time $t_{PD}$.

Even if high speed devices are used to speed up the peak value detecting operation (increasing the comparison speed), there is a limit to the read/write speed of the memory for storing a detected peak value, hindering an increase speed of the peak of value detecting operation. The operation speed of a memory is slower than an A/D conversion speed of an A/D converter, hindering an increase speed of the peak of value detecting operation.

A digital oscilloscope with expected high speed sampling and high resolution uses a combination of a circuit for detecting/storing a waveform peak value and a display. With a circuit for detecting/storing a waveform peak value of a related art, however, the operation speed of a peak value detecting unit is slow and therefore a high speed circuit has been long desired.

SUMMARY OF THE INVENTION

It is an object of the present invention to solve the above problems of the related art and provide a method and apparatus for detecting/storing a peak value of a waveform capable of speeding up a data comparison operation and hence a peak value detection operation, by using inexpensive devices.

It is another object of the present invention to provide a method and apparatus for detecting/storing a peak value of a waveform capable of speeding up a data comparison operation and hence a peak value detection operation, without using a high speed memory.

According to an aspect of the present invention, there is provided a method of detecting a peak value of a waveform signal continuously input, including the steps of:

a) sequentially sampling the waveform signal continuously input and converting respective sampled values into consecutive trains of digital data of n-bit (n is an integer of 2 or larger) in synchronism with a first clock signal;

b) dividing each train of the converted n-bit digital data at least into two groups and obtaining at least an upper sub-data set and a lower sub-data set;

c) comparing the upper sub-data set obtained in step b) with an upper sub-data set obtained previously and stored in a first latch, and judging which upper sub-data set has a peak value;

d) if the step c) judges that the upper sub-data set obtained in step b) has a peak value, updating the contents of the first latch by the upper sub-data set obtained in step b), in synchronism with of the first clock signal;

e) in accordance with judgement result in step c), updating the contents of a second latch with the lower sub-data set obtained in step b) corresponding to the upper sub-data set obtained in step b); and f) outputting digital data of the upper and lower sub-data sets in the first and second latches as digital data having a peak value of the waveform signal continuously input during a period of the second clock signal, in synchronism with a second clock signal having a period N (N is an integer of 2 or larger) times as long as the period of the first clock signal.

According to another aspect of the present invention, there is provided a peak value detecting apparatus for detecting a peak value of an input waveform signal, including:

an A/D converter for sequentially sampling the input waveform signal and converting respective sampled values into consecutive trains of digital data, and dividing each train of the converted digital data into at least two groups to obtain at least an upper sub-data set and a lower sub-data set;

a first comparator for comparing an upper sub-data set from the A/D converter with an upper sub-data set stored in a first latch and having a peak value among the previous upper sub-data sets to judge which upper sub-data set has a peak value, and outputting a judgement result, wherein the contents of the first latch are updated by the upper sub-data set from the A/D converter if the judgement result of the first comparator indicates a first state that the upper sub-data set from the A/D converter has a peak value;

a second comparator for comparing a lower sub-data set from the A/D converter with a lower sub-data set stored in a second latch to judge which lower sub-data set has a peak value, and outputting a judgement result, wherein the contents of the second latch are updated by the lower sub-data set from the A/D converter in accordance with the judgement results by the first and second comparators; and a memory for storing the upper and lower sub-data sets in the first and second comparators after each predetermined time lapse, as digital data having a peak value of the waveform signal input during the predetermined time.

As described above, according to the present invention, a signal waveform is sampled and converted into consecutive trains of digital data. Each train of digital data is divided into at least two groups (for example, depending upon the number of bits constituting each data train). Each divided data group is subjected to a comparison operation (processing) to obtain a peak value of digital data of an input waveform signal. Accordingly, even if the number of bits of digital data of an input waveform signal increases, it is possible to prevent an increase of the number of bits of digital data to be compared and to suppress an increase of the delay time $t_{PD}$, resulting in an increase in the speed of the operation for obtaining a peak value. With an increased number of divided groups, it is possible to speed up a peak value detection operation by using inexpensive devices.

A write operation of a peak value into the memory is performed at a timing having a longer period than that of a comparison operation timing at which each train of digital data is compared. Specifically, a maximum or minimum peak value of a plurality of peak values obtained by comparison operations of respective data trains is written in the memory at a predetermined time interval. As a result, a memory read/write operation can be performed at a lower speed than the comparison operation. Since the peak detection speed can be raised without increasing the memory read/write operation speed, a peak value can be detected at high speed by using A/D converters of high data conversion speed.

Still further, if such a peak value detecting method and apparatus is applied to a waveform display unit such as an oscilloscope, a peak value of a waveform signal continuously input can be observed at high speed by using an inexpensive apparatus.

DESCRIPTION OF THE PREFERRED EMBODIMENTS

Embodiments of a waveform peak value detecting/storing circuit according to the invention will be described with reference to the accompanying drawings.

Figure 1:
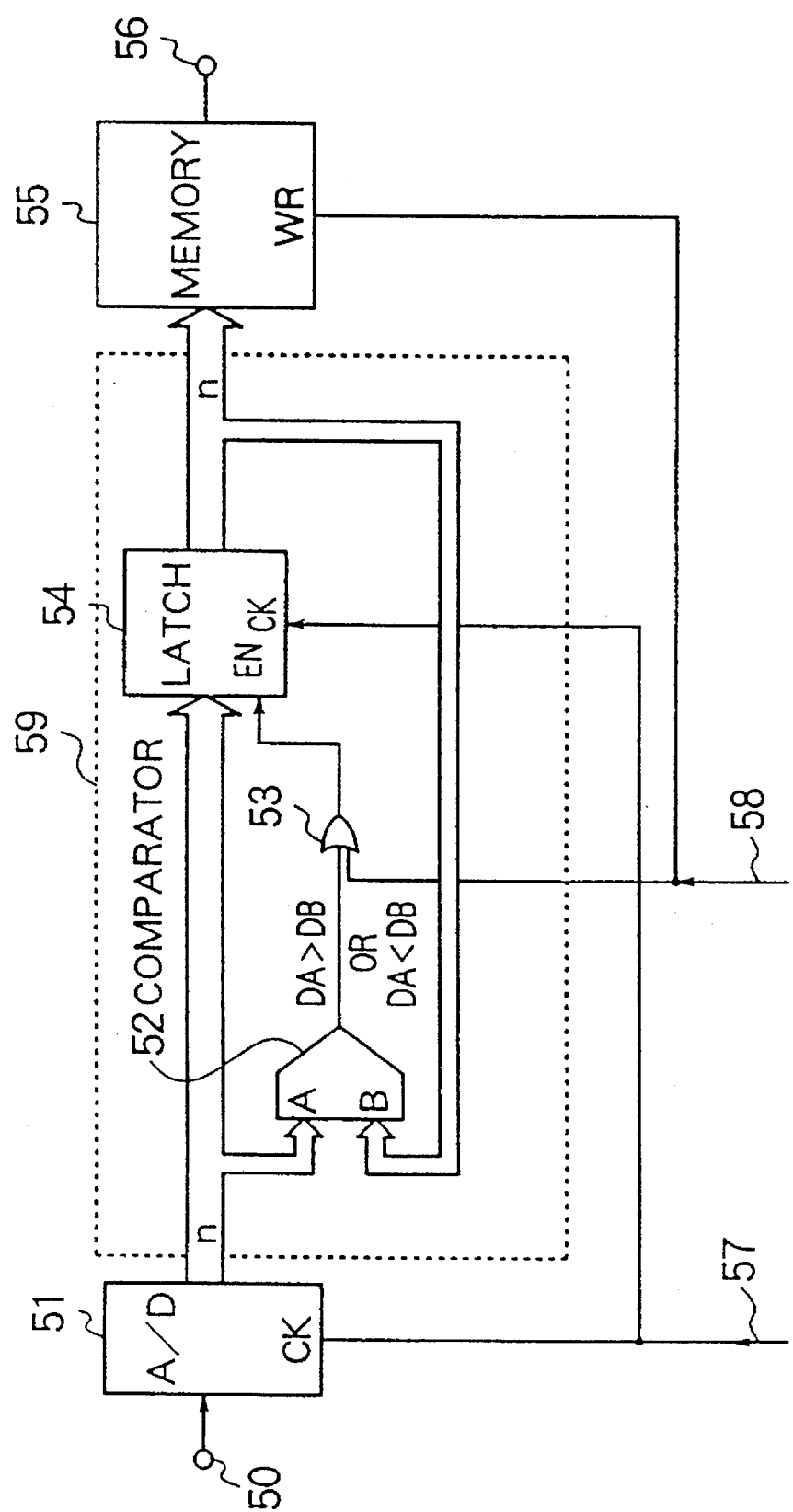
FIG. 1 is a block diagram showing the structure of a typical example of a circuit for detecting/storing a waveform peak value according to the related art.
Figure 2:
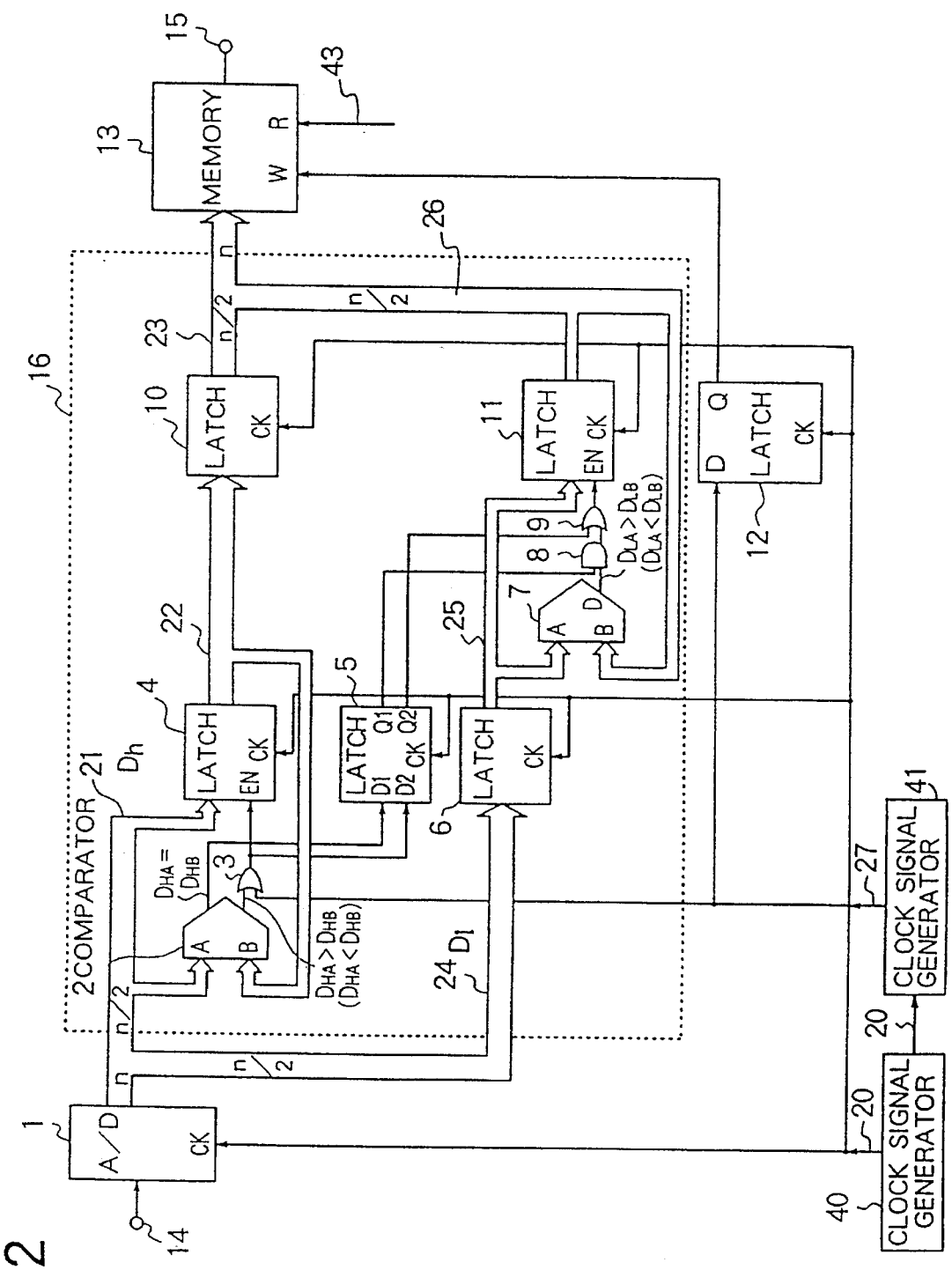
FIG. 2 is a block diagram showing the structure of a circuit for detecting/storing a waveform peak value according to an embodiment of the invention.
Figure 3:
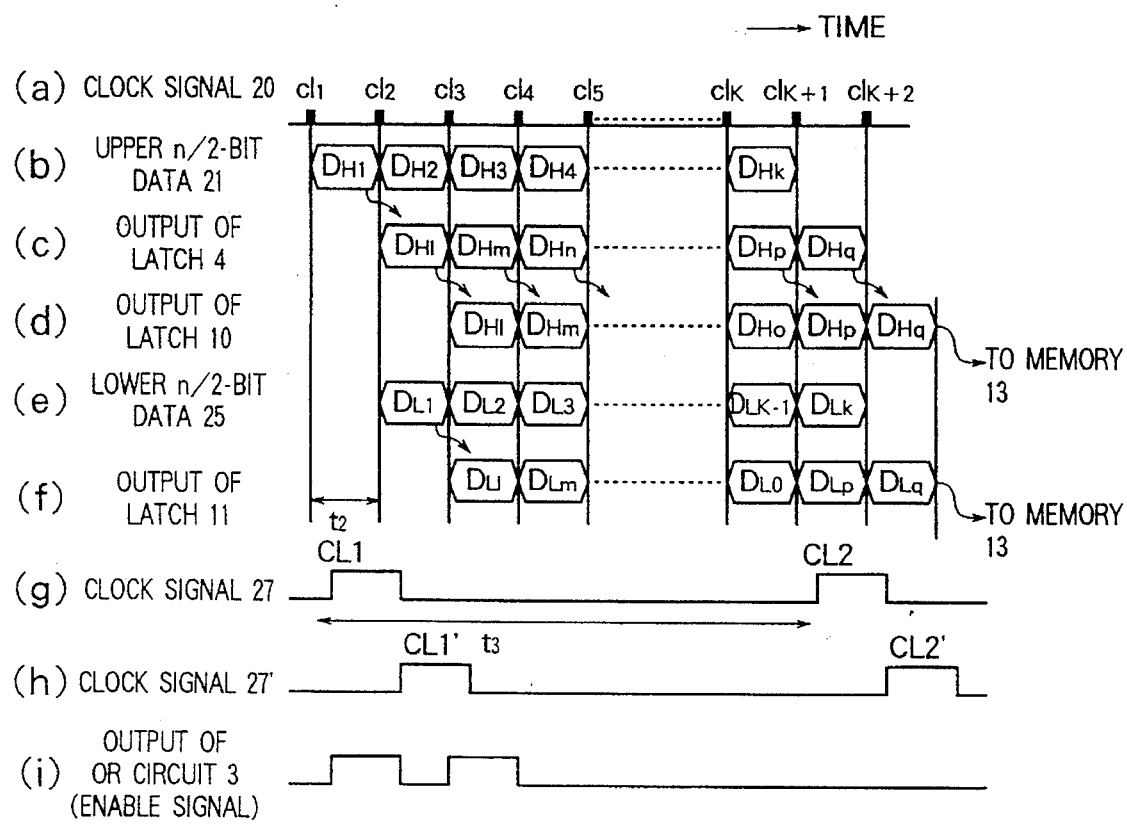
FIG. 3 is a timing chart of data and signals at various circuit portions, explaining the operation of the embodiment shown in FIG. 2.

FIG. 2 is a block diagram showing the structure of a circuit for detecting/storing a waveform peak value according to the first embodiment of the invention, and FIG. 3 is a timing chart of data and signals at various circuit portions.

Similar to the related art, in FIG. 2, only one of the maximum and minimum value detecting units is shown as a peak value detecting unit of the waveform peak value detecting/storing circuit. In the following description, a maximum value detecting unit is used as a representative of the peak value detecting unit, and a maximum value is derived as the peak value. It is obvious that the same technology is applicable to detecting a minimum value.

Referring to FIG. 2, an A/D converter 1 samples an analog input waveform signal applied to an input terminal 14 at a timing of a first clock signal 20 (indicated at (a) in FIG. 3) and converts each sampled value into n-bit (n is an integer of 2 or larger) digital data. A maximum value detecting unit detects a maximum value. Data processing at this unit is performed by dividing an output of the A/D converter 1 into upper n/2-bit data (upper sub-data) 21 ($D_H$) and lower n/2-bit data (lower sub-data) 24 (Dr).

A maximum value detecting unit for the upper n/2-bit data 21 includes a comparator 2, an OR gate 3, a latch 4, and another latch 10. The comparator 2 compares a digital data input A (supplied from the A/D converter 1) with a digital data input B (supplied from the latch 4), and outputs a signal indicating a comparison result. The OR gate 3 outputs a signal (an enable signal for the latch 4) in accordance with a digital output signal from the comparator 2 and a second clock signal 27. The latch 4 latches the upper n/2-bit data 21 from the A/D converter 1 at a clock timing of the first clock signal 20 when the enable signal takes, for example, a high level. The latch 10 latches the maximum data value from the latch 4 at a clock timing of the first clock signal 20.

The clock signals 20 and 27 are generated by clock signal generators 40 and 41, respectively.

A maximum value detecting unit for the lower n/2-bit data 24 includes a latch 6, a comparator 7, a latch 5, an AND gate 8, an OR gate 9, and a latch 11. The latch 6 latches the lower n/2-bit data 24 from the A/D converter 1 at a clock timing of the first clock signal 20. The comparator 7 compares a digital data input A (data 25 from the latch 6) with a digital data input B (data 26 from the latch 11), and outputs a signal indicating a comparison result. The latch 5 latches two input signals from the comparator 2 and OR gate 3 at a clock timing of the first clock signal 20. The AND gate 8 outputs a signal in accordance with the levels of two input signals from the latch circuit 5 and comparator 7. The OR gate 9 outputs a signal (an enable signal for the latch 11) in accordance with the levels of two input signals from the latch circuit 5 and AND gate 8. The latch 11 latches the lower n/2-bit data 25 from the latch 6 at a clock timing of the first clock signal 20.

The maximum value detecting units for the upper and lower n/2-bit data 21 and 24 constitute a maximum value detecting unit 16. As described earlier, only one deriving unit for detecting one of the maximum and minimum values is shown in FIG. 2. Both the maximum and minimum value detecting units are required for detecting and storing the maximum and minimum values.

A memory 13 stores output data 23 from the latch 10 which latches maximum value data 22 of the upper n/2-bit data 21, and stores output data 26 from the latch 11 which latches maximum value data 25 of the lower n/2-bit data 24. A latch 12 latches the second clock signal 27 at a clock timing of the first clock signal 20 to delay the second clock signal 27.

Next, the operation of the waveform peak value detecting/storing circuit of this embodiment will be described. Referring to FIG. 2, an analog input waveform signal applied to the input terminal 14 of the waveform peak value detecting/storing apparatus is supplied to the A/D converter 1 and converted into n-bit digital data at a clock timing of the first clock signal 20 ((a) in FIG. 3). The digital data is divided into upper n/2-bit data 21 ($D_H$) ((b) in FIG. 3) and lower n/2-bit data 24 ($D_L$) and supplied to the maximum value detecting unit 16.

The upper n/2-bit data 21 divided from the n-bit data output form the A/D converter 1 is supplied to the latch 4 for latching data at a timing of the first clock signal 20 and to the input A of the comparator 2.

The comparator 2 is input, at its input A, with the upper n/2-bit data 21 ($D_{HA}$) supplied from the A/D converter 1, and at its other input B with upper n/2-bit data 22 ($D_{HB}$) ((c) in FIG. 3) latched by the latch circuit 4 and delayed by one clock of the first clock signal 20. The comparator 2 outputs a comparison result to the OR gate 3.

The comparator 2 is input, at its inputs A and B, with the data $D_{HA}$ and $D_{HB}$, compares the input data, and outputs a comparison result. The comparison results include $D_{HA}>D_{HB}$, $D_{HA}<D_{HB}$, and $D_{HA}=D_{HB}$. In this example, a maximum value is detected. Therefore, the comparator 2 outputs, for example, a high level signal from its output terminal D to the OR gate 3 if the input data $D_{HA}$ is larger than the input data ($D_{HA}>D_{HB}$). If $D_{HA}<D_{HB}$ or if $D_{HA}=D_{HB}$, the signal at the output terminal D becomes a low level signal. In the case of $D_{HA}=D_{HB}$, the comparator 2 outputs from its output terminal C, for example, a high level signal, to the latch 5. If $D_{HA}<D_{HB}$ or if $D_{HA}>D_{HB}$, a low level signal is therefore output from the output terminal C.

If the apparatus shown in FIG. 2 is set to detect a minimum value, the comparator 2 is set to output from its output terminal D, for example, a high level signal, to the OR gate when the value of the input data $D_{HA}$ is smaller than that of the input data $D_{HB}$.

If the peak value detecting/storing apparatus is set to detect both the maximum and minimum values, two detecting units 16 shown in FIG. 2 are provided to respectively detect $D_{HA}<D_{HB}$, and $D_{HA}>D_{HB}$.

The OR gate 3 is input with a signal from the output terminal D of the comparator 2 and the second clock signal 27 ((g) in FIG. 3). The OR gate 3 supplies the high level signal for $D_{HA}>D_{HB}$ or a clock of the second clock signal 27 to the latch 4 as its enable signal, and to the latch 5 as one of its input signal.

The latch 4 enters the enable state in response to an enable signal from the OR gate 3, and under this state the upper n/2-bit data 21 from the AD converter 1 is latched in response to the rising edge of a clock of the first clock signal 20 and output as data 22 ($D_{HB}$) ((c) in FIG. 3) to the latch 10 and the input B of the comparator 2.

The latch 10 latches the maximum value data 22 supplied from the latch 4 in response to a clock of the first clock signal 20, and outputs the maximum data 23 ((d) in FIG. 3) delayed by one clock of the first clock signal 20 from the maximum data 23, to the memory 13. The latch operation of the data 22 by the latch 10 makes the phases of the output data 26 of the latch 11 and the output data 23 of the latch 10 coincide with each other.

The relationship between the first and second clock signals 20 and 27 will be described. First, the first and second clock signals 20 and 27 are synchronized clock signals. Second, there is one or more periods of the first clock signal 20 within one period of the second clock signal 27. If one period is included, i.e., if the periods of the first and second clock signals 20 and 27 are equal, input data is output directly without the comparison operation.

Therefore, the clock signal generator 41 may output the clock signal 27 by dividing (e.g., in the example shown in FIG. 3, dividing by 1/k where k is an integer of 2 or larger) the clock signal 20 generated by the clock signal generator 40.

Each clock of the clock signal 27 is set to rise between two consecutive clocks of the first clock signal 20 and to fall between next two consecutive clocks of the first clock signal 20. Therefore, the clock signal generator 41 may output the clock signal 27 by dividing the clock signal 20 and delaying it by a predetermined time.

The operation of detecting a maximum value of the upper n/2-bit data by the maximum value detecting unit 16 will be described with reference to the timing chart shown in FIG. 3.

First, the upper n/2 bit data $D_{H1}$ sampled and converted by the A/D converter 1 at the timing of a clock c11 of the first clock signal 20 is applied to the input A of the comparator 2 and latch 4. Since a clock CL1 of the clock signal 27 is thereafter applied to the OR gate 3 which in turn supplies it as an enable signal to the latch 4, the latch 4 supplies the data $D_{H1}$ in response to the rising edge of the next clock c12 of the clock signal 20 to the input B of the comparator 2, irrespective of a comparison result of the comparator 2. As a result, the comparator 2 compares the next data $D_{H2}$ applied to its input A with the data $D_{H1}$ at its input B, and outputs a comparison result after the rising of the clock $Cl_2$. If $D_{H2}>D_{H1}$, the output D supplies a high level signal to the OR gate 3 to enable the latch 4, and the latch 4 outputs the data $D_{H2}$ and replaces the data $D_{H1}$ by it in response to the rising edge of the next clock c13 of the clock signal 20. If $D_{H2}<D_{H1}$ or if $D_{H2}=D_{H1}$, the latch 4 continues holding the data $D_{H1}$. Data $D_{Hm}$ indicated at (c) in FIG. 3 represents a maximum value of data $D_{H2}$ and $D_{H1}$.

Thereafter, input data is sequentially compared and latched in the manner similar to the above operation. Of data indicated at (c) in FIG. 3, data $D_{Hn}$ represents a maximum data value of data $D_{H1}$ to $D_{H3}$, data $D_{Hp}$ represents a maximum data value of data $D_{H1}$ to $D_{H(k-1)}$, and data $D_{Hq}$ represents a maximum data value of data $D_{H1}$ to $D_{Hk}$. (i) of FIG. 3 shows an output of the OR circuit, which shows a case where an enable signal is delivered when the result of the comparison is delivered after the clock c13 of the clock signal 20. As clear from (i) of FIG. 3, the enable signal is delivered during a period after the rising edge of the clock c13 and before the falling edge of the next clock c14.

The data output from the latch 4 is delayed by one clock of the first clock signal 20 by the latch 10 and output therefrom. The data output from the latch 10 is written in the memory 13 in response to a clock signal 27' from the latch 12, the clock signal 27' being obtained from the clock signal 27 by delaying it by one clock of the first clock signal 20 at the latch 12. That is to say, maximum value data $D_{Hq}$ of the data $D_{H1}$ to $D_{Hk}$ is written in the memory 13 in response to a clock CL2' of the clock signal 27'.

Next, the operation of detecting a maximum value of the lower n/2-bit data will be described.

The lower n/2-bit data 24 divided from the n-bit data output from the A/D converter 1 is supplied to the latch 6 for latching data at a clock timing of the first clock signal 20.

The latch 6 latches the input lower n/2-bit data 24 at a timing of the first clock signal 20, and outputs the data 25 (at (e) in FIG. 3) delayed by one clock of the clock signal 20 to the latch 11 and the input A of the comparator 7. The latch operation of the data 24 by the latch 6 makes the phases of the output data 22 of the latch 4 and the output data 25 of the latch 6 coincide with each other.

The comparator 7 is input at its input A with the lower n/2-bit data 25 ($D_{LA}$) from the latch 6 delayed by one clock of the first clock signal, and at its input B with the lower n/2-bit data 26 ($D_{LB}$) latched by the latch 11 and delayed further from the data by one clock of the first clock signal 20. The comparator 7 outputs a comparison result between the input data 25 and 26, to the AND gate 8. Similar to the comparator 2, the comparator 7 is input with data at its inputs A and B, and compares the data. The comparison results include $D_{LA}>D_{LB}$, $D_{LA}<D_{LB}$, and $D_{LA}=D_{LB}$. In this example, a maximum value is detected. Therefore, the comparator 7 outputs, for example, a high level signal, from its output terminal D to the AND gate 8 if the input data $D_{LA}$ at the input A is larger than the input data at the input B ($D_{LA}>D_{LB}$), or if $D_{LA}<D_{LB}$ in the case of detecting a minimum value.

Since the n-bit data is divided into the upper and lower n/2-bit data to detect a maximum value of the n-bit data, it is necessary to detect a maximum value of the lower n/2-bit data in accordance with the detected maximum value of the upper n/2-bit data.

To this end, the latch 5 is input at its input terminals $D_1$ and $D_2$ with an output signal of the comparator 2 at the terminal C representing $D_{HA}=D_{HB}$ and an output signal of the OR gate 3 representing $D_{HA}>D_{HB}$ (for the detection of a minimum value, $D_{HA}<D_{HB}$), latches these signals at a timing of the first clock signal 20, and outputs them from its terminals $Q_1$ and $Q_2$ to the AND gate 8 and OR gate 9, respectively. The latch operation of the signals representing $D_{HA}=D_{HB}$, and $D_{HA}>D_{HB}$ by the latch 5 makes the phases of these signals and the output data of 25 of the latch 6 coincide with each other.

The AND gate 8 is input with an output signal of the latch 5 and an output signal of the comparator 7, and outputs a signal determined by the logical levels of the two inputs to the OR gate 9.

The OR gate 9 is input with an output signal of the latch 5 at its output terminal $Q_1$ and an output signal of the AND gate 8.

Therefore, the OR gate 9 supplies an enable signal to the latch 11 if a comparison result of the upper n/2-bit data is $D_{HA}>D_{HB}$, irrespective of a comparison result of the lower n/2-bit data, or if a comparison result of the upper n/2-bit data is $D_{HA}=D_{HB}$ and a comparison result of the lower n/2-bit data is $D_{LA}>D_{LB}$.

When the latch 11 is enabled by an enable signal supplied from the OR gate 9, it latches the lower n/2-bit data 25 supplied from the latch 6 in response to a clock of the first clock signal 20, and outputs the latched data, as the lower n/2-bit data 26 ((f) in FIG. 3) contained in the n-bit data having a maximum value during a predetermined time period (i.e., the period t3 of the clock signal 27), to the memory 13.

The memory 13 stores the maximum value data 23 of the upper n/2-bit data supplied from the latch 10 and the data 26 of the lower n/2-bit data supplied from the latch 11, as a maximum value of the n-bit data, in response to a clock of the clock signal 27', the stored data being read and output from the output terminal 15 as the output data of the peak value detecting/storing apparatus.

The operation of detecting a maximum value of the lower n/2-bit data will be described in more detail. When the comparator 2 detects $D_{HA}=D_{HB}$ (i.e., when it is detected that the upper bit data 21 has the same maximum value as that of the upper bit data sampled at any time before the upper bit data 21 during the period t3 of the clock signal 27), the output signal of the latch 5 is supplied to one input of the AND gate 8 to make it high level. At this time if a comparison result of the comparator 7 is $D_{LA}>D_{LB}$ (i.e., if the lower bit data 25 has a larger maximum value than that of the lower bit data sampled at any time before the lower bit data 25 during the period t3), then the other input of the AND gate 8 also takes the high level.

As a result, the OR gate 9 outputs an enable signal to the latch 11 so that the lower bit data at this time is latched. Specifically, the lower bit data in the latch 11 is rewritten only when the upper bit data 21 has the same maximum value as that of the upper bit data during the period t3 and a comparison result of the lower bit data is $D_{LA}>D_{LB}$.

When the comparator 2 detects $D_{HA}>D_{HB}$, a high level signal is supplied via the OR gate 3 and latch 5 to the OR gate 9 so that the latch 11 is enabled and it latches the lower bit data 25 at that time irrespective of a comparison result of the comparator. In the above manner, the lower n/2-bit data contained in the n-bit data having a maximum value at any sampling timing during the period t3 is detected.

The operation of the maximum value detector 16 will be further described with reference to FIG. 3. A waveform signal input to the A/D converter 1 is A/D converted at the first clock cl1 of the first clock signal 20. Of the A/D converted n-bit serial data, the first upper n/2-bit data set 21 ($D_{H1}$) during the period t3 is unconditionally latched by the latch 4 at the second clock c12 of the first clock signal 20 because the latch 4 has been enabled by the first clock CL1 of the second clock signal 27.

Next, before the timing of the third clock c13 of the first clock signal 20, the comparator 2 compares the first upper n/2-bit data set 21 ($D_{H1}$) with the second upper n/2-bit data set 21 ($D_{H2}$), and outputs a comparison result from its output terminal D to the latch 4. The latch 4 latches either the first data set or the second data set in accordance with an output from the comparator 2.

Such a comparison operation is performed at each period t2 of the first clock signal 20 during the period t3 of the second clock signal 27. The latch 10 latches the output data 22 of the latch 4 at a clock of the first clock signal 20, and the output data 23 of the latch 10 is supplied to the memory 13.

In the above manner, of the upper n/2-bit data sets during the period t3, the upper n/2-bit data set having a maximum value is stored in the memory 13. Similar operations are repeated at succeeding periods t3.

The first lower n/2-bit data 24 ($D_{L1}$) during the period t3 is latched by the latch 6 at the second clock c12 of the first clock signal 20. In this case, the first clock CL1 of the second clock signal 27 is supplied via the OR gate 3 to the latch 5 whereat it is delayed by one clock of the first clock signal 20 to make it have the same phase as the clock signal 27'. The delayed signal is then supplied via the OR gate 9 to the latch 11 to enable it. Therefore, the first lower n/2-bit data 25 ($D_{L1}$) is unconditionally latched by the latch 11 and the second n/2-bit data 24 ($D_{L2}$) is latched by the latch 6, respectively at the third clock c13 of the first clock signal 20.

Thereafter, a comparison operation like the upper n/2-bit data is performed and the output data 26 of the latch 11 is supplied to the memory 13.

An enable signal supplied to the latch 11 is determined by the signals representing $D_{HA}=D_{HB}$ and $D_{HA}>D_{HB}$ of the upper n/2-bit data, delayed by the latch by one clock of the first clock signal 20, and subjected to the AND operation at the AND gate 8 and to the OR operation at the OR gate 9, respectively.

Therefore, the lower n/2-bit data 25 is latched by the latch 11 as the lower n/2-bit data contained in the n-bit data having a maximum value at any sampling timing during the period t3, if a comparison result of the upper n/2-bit data is $D_{HA}>D_{HB}$, irrespective of a comparison result of the lower n/2-bit data. Similarly, the lower n/2-bit data 25 is latched by the latch 11 as the lower n/2-bit data contained in the n-bit data having a maximum value at any sampling timing during the period t3, if a comparison result of the upper n/2-bit data is $D_{HA}=D_{HB}$ and a comparison result of the lower n/2-bit data is $D_{LA}>D_{LB}$.

In the above manner, the latch 11 latches the lower n/2-bit data contained in the n-bit data having a maximum value at any sampling timing during the period t3. Accordingly, the lower n/2-bit data $D_{Lq}$ contained in the n-bit data having a maximum value during the period t3 is stored in the memory 13 in response to a clock of the clock signal 27'.

Data $D_{Lm}$, $D_{Lo}$, $D_{Lp}$, and $D_{Lq}$ represent the lower n/2-bit data sets in the n-bit data having maximum values during the periods from the clock c12 of the first clock signal 20 to clocks c14, clk, clk+1, and clk+2, respectively.

A maximum value of the n-bit data constituted by the upper and lower n/2-bit data having the same phase can be stored in the memory 13 because the outputs of the upper and lower n/2-bit latches 10 and 11 are adjusted to have the same delay phase relative to a clock of the first clock signal as described previously.

As described above, in this embodiment, a comparison operation is performed synchronously with the first clock signal 20 during the whole period t3 of the second clock signal 27 longer than the period t2 of the first clock signal 20 to detect a maximum value of the n-bit data which is thereafter stored in the memory 13 synchronously with the clock signal 27'. It is therefore possible to set the read/write timing period of the memory 13 longer than the comparison operation timing period. A high speed memory is therefore unnecessary. As the period t3 of the clock signal 27 is set longer than the period t2 of the clock signal 20, the operation speed of the memory 13 can be set to be slower.

Reading data written in the memory 13 is performed synchronously with a read clock signal 43 generated by a clock signal generator such as a microcomputer (not shown). A clock of the read clock signal 43 is set to be asynchronous with a write clock of the memory 13, and the period of the read clock may be longer or shorter than the read clock.

Figure 4:
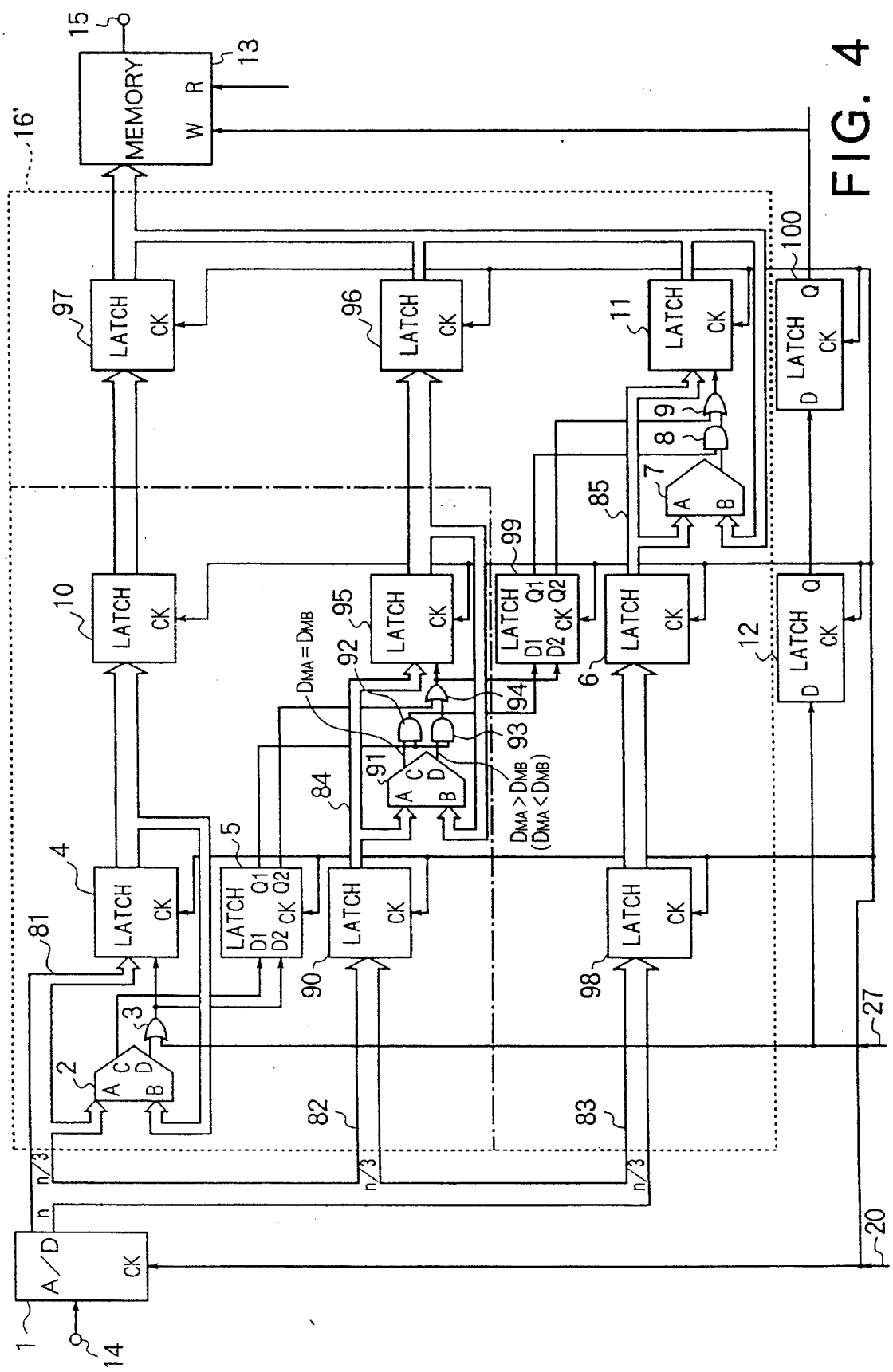
FIG. 4 is a block diagram showing the structure of a circuit for detecting/storing a waveform peak value according to a second embodiment of the invention.

Next, a waveform peak value detecting/storing apparatus according to the second embodiment of the invention will be described with reference to FIG. 4. Although n-bit data is divided into two groups in the first embodiment, the invention is also applicable to division by three or more. In the second embodiment, n-bit data is divided into three groups. In FIG. 4, elements having like functions are represented by using identical reference numerals, and the description thereof is omitted. In this embodiment, detecting a maximum value as a peak value will be described.

In the second embodiment, n-bit data is divided into three groups including an upper n/3-bit data set 81, a middle n/3-bit data set 82, and a lower n/3-bit data set 83 which are supplied to latches 4, 90, and 93. In FIG. 4, a maximum value detecting unit 16' corresponding to the unit 16 of the first embodiment is enclosed by a one-dot chain line.

The circuit structure (comparator 2, latches 4 and 5, and OR gate 3) for detecting a maximum value of the upper n/3-bit data is the same as shown in FIG. 2. However, a latch 97 is additionally provided for the synchronization of the phases of the upper and middle n/3-bit data.

The circuit structure for detecting a maximum value of the middle n/3-bit data includes latches 90, 95, and 96, a comparator 91, AND gates 92, and an OR gate 94. The operation of the latches 90 and 95, comparator 91, AND gate 93, and OR gate 94 is generally the same as that of the latches 6 and 11, comparator 7, AND gate 8, and OR gate 9 constituting the circuit for detecting a maximum value of the lower n/3-bit data. However, similar to the comparator 2, the comparator 91 has an output terminal C and outputs a high level signal to one input terminal of the AND gate 92 when middle n/3-bit data $D_{MA}$ to an input terminal A is equal to middle n/3-bit data $D_{MB}$ to an input terminal B. To the other input terminal of the AND gate 93, a signal from the output terminal Q1 of the latch 5 is supplied. An output of the AND gate 93 is applied to the input D1 of the latch 99. A high level signal is applied to the input D1 of the latch 99 when the upper n/3-bit data $D_{HA}$ to the input terminal A of the comparator 2 is equal to the upper n/3-bit data $D_{HB}$ to the other input terminal B and when the middle n/3-bit data $D_{MA}$ is equal to the middle n/3-bit data $D_{MB}$ to the input terminal B. The latch operation by the latch 96 synchronizes the phases of the middle and lower n/3-bit data. If a comparison result of the upper n/3-bit data is $D_{HA}>D_{HB}$, middle n/3-bit data 84 is latched by the latch 95 as the middle n/3-bit data contained in the n-bit data having a maximum value sampled at any timing during the period t3, irrespective of the comparison result by the middle n/3-bit data. If a comparison result of the upper n/3-bit data is $D_{HA}=D_{HB}$ and a comparison result of the middle n/3-bit data is $D_{MA}>D_{MB}$, also the middle n/3-bit data is latched by the latch 95 as the middle n/3-bit data contained in the n-bit data having a maximum value sampled at any timing during the period t3.

The circuit structure (comparator 7, latches 6 and 11, and OR gate 9) for detecting a maximum value of the lower n/3-bit data is the same as shown in FIG. 2. However, a latch 98 is additionally provided for the synchronization of the phases of the middle and lower n/3-bit data. The latch circuit 99 for supplying an enable signal to the latch 11 corresponds to the latch 5 shown in FIG. 2, and as described above, a signal to the input D1 becomes a high level signal only when $D_{HA}=D_{HB}$ and $D_{MA}=D_{MB}$. Therefore, if a comparison result of the middle n/3-bit data is $D_{MA}>D_{MB}$, lower n/3-bit data 85 is latched by the latch 11 as the lower n/3-bit data contained in the n-bit data having a maximum value sampled at any timing during the period t3, irrespective of a comparison result of the lower n/3-bit data. If a comparison result of the upper n/3-bit data is $D_{HA}=D_{HB}$, if a comparison result of the middle n/3-bit data is $D_{MA}=D_{MB}$, and if a comparison result of the lower n/3-bit data is $D_{LA}>D_{LB}$, the lower n/3-bit data is also latched by the latch 11 as the lower n/3-bit data contained in the n-bit data having a maximum value sampled at any timing during the period t3.

As a result, in this embodiment as well, a maximum value of n-bit data is stored in the memory 13 at each period t3 of the clock signal 27.

If n-bit data is divided into four or more groups, the circuit structures for the uppermost and lowest bits-data and the circuit structure for intermediate bits-data are constituted like those circuits for the upper and lower n/3-bit data and for the middle n/3-bit data shown in FIG. 4.

In the first embodiment, n-bit data is divided into two groups each constituted by the n/2-bit data. This division may be m-bit data and n-bit data where m and p are an integer and m+p=n. Similarly, if n-bit data is divided into three or more groups, each group may have the number of bits different from another group.

Figure 5:
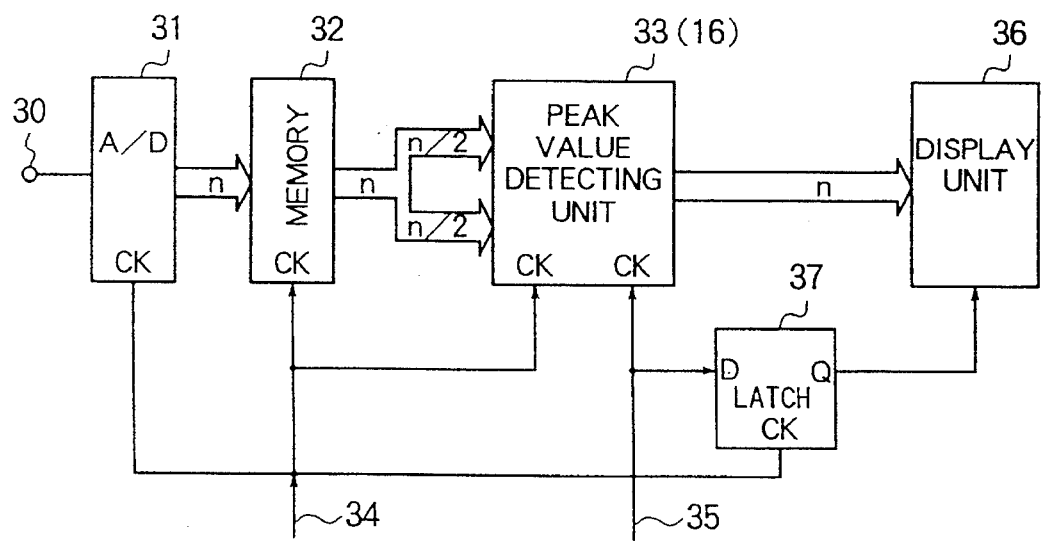
FIG. 5 is a block diagram showing the structure of a circuit for detecting/storing a waveform peak value according to a third embodiment of the invention.

The third embodiment of the invention will be described with reference to FIG. 5. FIG. 5 is a block diagram showing the structure of a display device having a waveform peak value detecting/storing apparatus such as the apparatus of the first embodiment. Like the first embodiment, only one peak value detecting unit for detecting either a maximum or minimum value is shown in FIG. 5.

The embodiment display device shown in FIG. 5 has an A/D converter 31, a memory 32, a peak (maximum) value detecting unit 33, and a display unit 36. The A/D converter 31 converts an analog input waveform signal applied to an input terminal 30 into n-bit digital data at a timing of a first clock signal 34. The memory 32 stores the n-bit digital data. The peak value detecting unit 33 detects a maximum value of n-bit data by using upper n/2-bit data and lower n/2-bit data. This unit has a circuit structure which is the same as the maximum value detecting unit 16 of the first embodiment, and so the detailed description is omitted. The clock signals 34 and 35 are assumed to correspond to the clock signals 20 and 27 of the first embodiment.

Next, the operation of the third embodiment will be described. Referring to FIG. 5, an analog input waveform signal applied to the input terminal 30 is supplied to the A/D converter 31, converted into n-bit digital data at a timing of the first clock signal 34, and stored in the memory 32.

The stored n-bit data is read from the memory 32 each time a maximum value is requested to be detected, by using the first clock signal as a data read signal. The read n-bit data is divided into upper n/2-bit data and lower n/2-bit data and supplied to the maximum value detecting unit 33 having comparators and latches.

The maximum value detecting unit 33 detects a maximum value of the upper n/2-bit data and a maximum value of the corresponding lower n/2-bit data. These maximum values of the divided upper and lower n/2-bit data are combined to form a maximum value of n-bit data if necessary. The display unit 36 has a memory (not shown) in which the maximum values are stored and by which the maximum value of n-bit data can be formed. An output of a latch 37 may be used as a timing signal for the display unit 36 to switch a display of a waveform.

Figure 6:
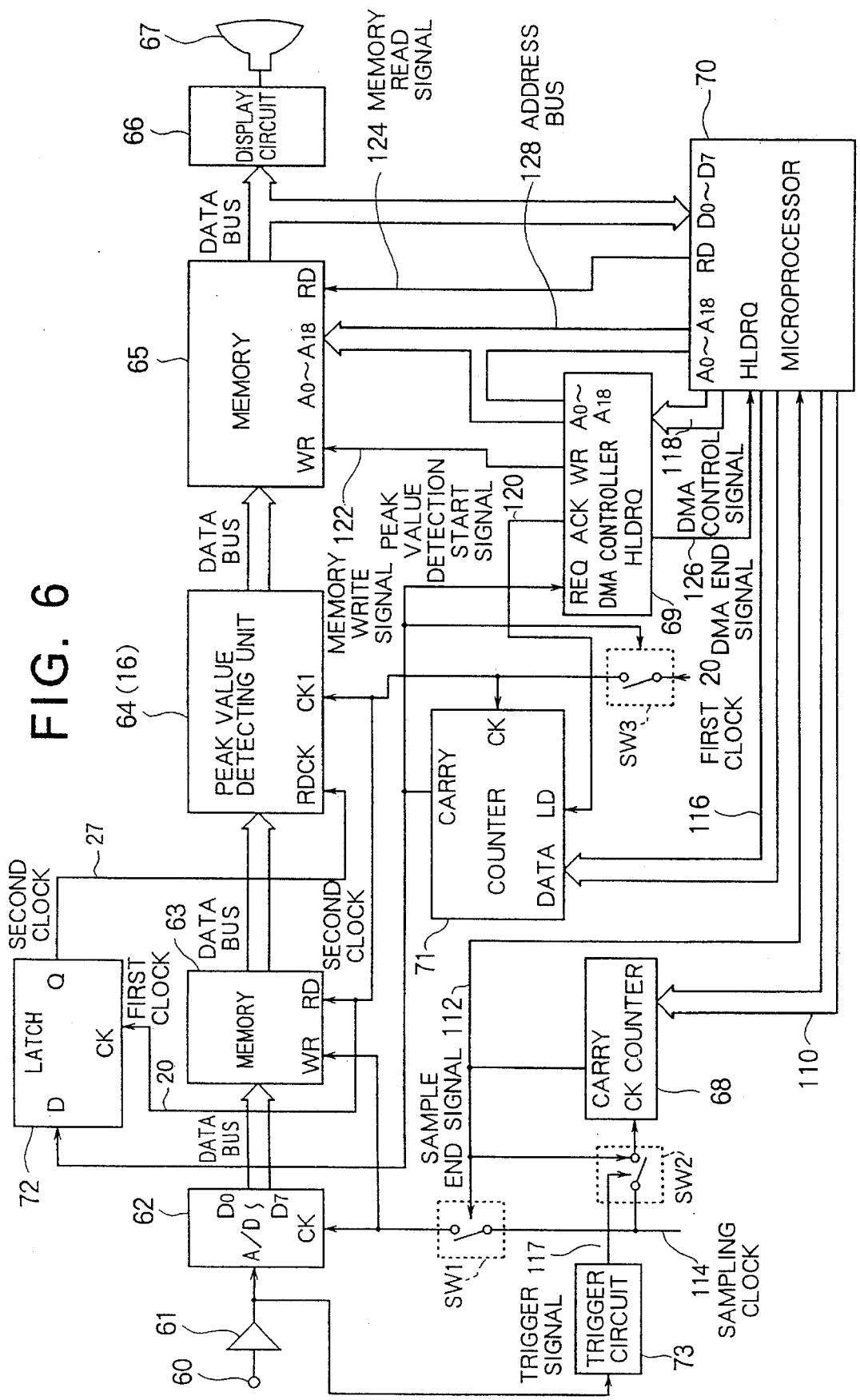
FIG. 6 is a block diagram showing the structure of an oscilloscope using a circuit for detecting/storing a waveform peak value of this invention.

FIG. 6 is a block diagram showing an example of an oscilloscope using a peak value detecting/storing apparatus of the invention. The oscilloscope shown in FIG. 6 includes an input terminal 60, an amplifier 61 for amplifying an analog input waveform signal to a predetermined level, an A/D converter 62 for converting an input waveform signal of the predetermined level to digital data, a memory 63 for storing data output from the A/D converter 62, a peak detecting unit 64 (in this example, only a maximum value detecting unit), a memory 65 for storing a maximum value supplied from the maximum value detecting unit, a display unit 66 for processing signals and supplying them to a display unit 67, and those devices for controlling the oscilloscope including counters 68 and 71, a trigger circuit 73, a latch 72, a $D_{MA}$ controller 69, and a microprocessor 70.

Next, the operation of this embodiment will be described. The peak value detecting unit 64 corresponds to the peak value detecting unit 16 shown in FIG. 2 and the peak value detecting unit 16' in FIG. 4.

An analog input waveform signal 60 is supplied via the amplifier 61 to the A/D converter 62 and trigger circuit 73. The microprocessor (CPU) 70 sets the value counted from the read start at the generation of a trigger signal to stop of the input waveform data by the memory 63, to the counter 68 via a count value setting data bus 110. The counter 68 sets its output sample end signal 112 to a disabled state so that a switch SW1 is closed and a sampling clock 114 is supplied to the A/D converter 62 and memory 63. In response to this sampling clock 114, the A/D converter 62 converts input waveform data into digital data and supplies the latter to the memory 63 which writes the supplied data therein.

When the level of input waveform data from the amplifier 61 reaches a predetermined value or greater, the trigger circuit 73 enables its output trigger signal 117 so that a switch SW2 is closed and the sampling clock 114 is supplied to the counter 68 which starts counting this clock. When the count value of the counter 68 reaches the preset count value, the sample end signal 112 is enabled to open the switches SW1 and SW2. As a result, the memory 63 stops reading input waveform data and the A/D converter 62 stops its operation. In this manner, data of an integer multiple of one display frame on the display unit 67 is stored in the memory 63.

In response to enabling the sample end signal 112, CPU 70 supplies a second clock period (number of comparison data sets) to the counter 71 via a count value setting bus 116. At this time, an output signal at a Q terminal of the latch 72, i.e., the second clock, takes a high level ("H") to output the clock CL1 (or CL2) shown in FIG. 3.

Next, CPU 70 supplies and sets a data quantity (capacity) to be transferred from the memory 63 to the memory 65, to the DMA controller 69 as a DMA control signal 118. This set value indicates the data quantity (capacity) to be supplied to the memory 65 and corresponding to the output data quantity from the peak value detecting unit 64.

CPU 70 supplies thereafter the DMA controller 69 with a DMA start request signal as the DMA control signal 118. In response to this, the following processes are executed.

(1) The DMA controller 69 enables an ACK (acknowledge) signal which is a peak value detection start signal 120. In response to this, the counter 71 loads the second clock period (number of comparison data sets) supplied from CPU 70. In response to this, a CARRY output of the counter 71 takes a low level ("L") so that a switch SW3 is closed and the counter 71 starts counting clocks of the first clock signal 20 supplied via the switch SW3. At the same time, the first clock signal 20 is also supplied to the memory 63 and peak value detecting unit 64 to start their operations.

(2) The first clock signal 20 is also supplied to the latch 72 so that a Q output takes the low level and continues to hold this level while the counter 71 is operating. As a result, the second clock from the latch 72 takes the high level only during one clock of the first clock signal 20 (refer to (g) in FIG. 3).

Data sequentially read from the memory 63 in response to clocks of the second clock signal, is supplied to the peak value detecting unit 64 allowing this unit 64 to perform the peak value detecting operation like the previously described embodiments.

(3) When the count value of the counter 71 reaches the number of comparison data sets, the CARRY output takes the high level to open the switch SW3 and terminates the count operation of the counter 71. This CARRY output is also supplied to a D input of the latch 72 whereat it is latched, making the output of the latch 72 take the high level. That is to say, the second clock signal 27 again takes the high level.

(4) Clocks of the second clock signal 27 are supplied to an RDCX input of the peak value detecting unit 64 which in turn outputs a peak value. The CARRY output is also supplied to an REQ input of the DMA controller 69 which in turn supplies the memory 65 with a write signal 122 to store the peak value from the peak value detecting unit 64 in the memory 65.

The processes (1) to (4) are repeated until the number of peak values supplied from the peak value detecting unit 64 reaches the data capacity set to the DMA controller 69. When this data capacity is satisfied, the DMA controller 69 sends an HLDRQ signal (DMA end signal) 126 to CPU 70 to inform CPU 70 of a completion of data transfer from the peak value detecting unit to the memory 65.

In response to this, CPU 70 supplies a memory read signal 124 to the memory 65 to read peak value data. CPU 70 converts the read peak value data into display data and supplies the latter to a display memory in the display circuit 66 to display a peak waveform on the display unit 67.

The characteristic feature of the third embodiment is that digital input waveform signal data itself is temporarily stored in the memory 32 prior to the peak value extraction process. Accordingly, necessary or arbitrary input waveform signals stored in the memory 32 can be selected at any time and their peak value can be detected.

According to the present invention, a delay time required for n-bit data output from an n-bit latch to be fed back via an n-bit data comparator can be shortened to a delay time required for n/α-bit data output from an n/α-bit latch to be fed back via an n/α-bit data comparator, reducing the number of bits to be processed, shortening a delay time $t_{PD}$, and raising a maximum operation speed.

Further, comparison between k trains of n-bit serial data can be performed during k+α clocks (α=2 in the example shown in FIG. 3, α being the number of divisions given for the peak value detecting unit). As compared to a conventional comparison time of (k +1)* t1 (t1 is a comparison time for n bits), a comparison time of this invention is (k +α)*t2(t2 is a comparison time of n/α bits).

Since t1>t2, the effects of this invention are enhanced as the number of k increases. As compared to a conventional operation speed which lowers as the number of bits increases, the operation speed of this invention can be prevented from being lowered significantly because the comparison operation can be achieved by adding only several clocks of comparison timings.

As described so far, according to the present invention, it is possible to provide a waveform peak value detecting/storing apparatus having a peak value detecting unit with comparators and latches, capable of realizing a high speed operation independent from an increase of the number of comparison bits, and realizing high speed comparison by using inexpensive low speed devices without a need of expensive high speed devices.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A peak value detecting apparatus for detecting a peak value of an input waveform signal, comprising:

an A/D converter for sequentially sampling said input waveform signal and converting respective sampled values into consecutive trains of digital data, and dividing each train of said converted digital data into at least two groups of data having at least an upper sub-data set and a lower sub-data set;

a first comparator for comparing an upper sub-data set from said A/D converter with an upper sub-data set stored in a first latch and having a peak value among previous upper sub-data sets to judge which upper sub-data set has a peak value, and outputting a judgement result thereof;

a first logical circuit for supplying a first enable signal to said first latch when the judgement result by said first comparator indicates a first state that said upper sub-data set from said A/D converter has a peak value;

the first latch whose contents are updated by the upper sub-data set from said A/D converter in response to said first enable signal;

a second comparator for comparing a lower sub-data set from said A/D converter with a lower sub-data set stored in a second latch to judge which lower sub-data set has a peak value, and outputting a judgement result thereof;

a second logical circuit for supplying a second enable signal to said second latch circuit in accordance with the judgement results by said first and second comparators;

the second latch whose contents are updated by the lower sub-data set from said A/D converter in response to said second enable signal; and a memory for storing the upper and lower sub-data sets in said first and second comparators after each predetermined time lapse, as digital data having a peak value of the waveform signal input during said predetermined time.

2. A peak value detecting apparatus according to claim 1, wherein:

said second logical circuit supplies said second enable signal to said second latch when a judgement result by said first comparator indicates that the upper sub-data set from said A/D converter and the upper sub-data set stored in said first latch have the same value and when a judgement result by said second comparator indicates the lower sub-data set from said A/D converter has a peak value; and said second logical circuit supplies said second enable signal to said second latch when a judgement result by said first comparator indicates said first state, irrespective of a judgement result of said second comparator.

3. A peak value detecting apparatus according to claim 1, further comprising:

a first clock signal generator for generating a first clock signal; and a second clock signal generator for generating a second clock signal having a period equal to said predetermined time and N (N being an integer of 2 or more) times as long as the period of said first clock signal, wherein:

said A/D converter sequentially samples said input waveform signal and converts respective sampled values into consecutive trains of digital data synchronously with said first clock signal, dividing each train of the digital data into at least the upper and lower sub-data sets, and outputting each of said trains, said first latch updates the contents thereof by the upper sub-data set from said A/D converter at a clock timing of said first clock signal when said first enable signal has been supplied, said second latch updates the contents thereof by the lower sub-data set from said A/D converter at a clock timing of said first clock signal when said second enable signal has been supplied, and said memory stores the upper and lower sub-data sets stored in said first and second comparators at a clock timing of said second clock signal.

4. A peak value detecting apparatus according to claim 3, wherein said first logical circuit outputs said first enable signal in response to a clock of said second clock signal, and said second logical circuit outputs said second enable signal to said second latch circuit in response to said first enable signal.

5. A peak value detecting apparatus for detecting a peak value of an input waveform signal, comprising:

an A/D converter for sequentially sampling said input waveform signal and converting respective sampled values into consecutive trains of digital data, and dividing each train of said converted digital data into at least two groups of data having at least an upper sub-data set and a lower sub-data set;

a first comparator for comparing an upper sub-data set from said A/D converter with an upper sub-data set stored in a first latch and having a peak value among previous upper sub-data sets, and outputting a comparison result;

the first latch, the contents of which are updated by said upper sub-data set from said A/D converter when the comparison result by said first comparator indicates a first state that said upper sub-data set from said A/D converter is larger than the upper sub-data set stored in said first latch;

a second comparator for comparing a lower sub-data set from said A/D converter with a lower sub-data set stored in a second latch, and outputting a comparison result;

the second latch, the contents of which are updated by said lower sub-data set from said A/D converter in accordance with the comparison results by said first and second comparators; and a memory for storing the upper and lower sub-data sets in said first and second comparators after each predetermined time lapse, as digital data having a maximum value of the waveform signal input during said predetermined time.

6. A peak value detecting apparatus according to claim 5, wherein:

the contents of said second latch are updated by said lower sub-data set from said A/D converter when a comparison result by said first comparator indicates a state other than said first state and when a comparison result by said second comparator indicates that the lower sub-data set from said A/D converter is larger than the lower sub-data set stored in said second latch; and the contents of said second latch are updated by said lower sub-data set from said A/D converter when a comparison result by said first comparator indicates said first state, irrespective of a comparison result of said second comparator.

7. A peak value detecting apparatus according to claim 5, further comprising:

a first clock signal generator for generating a first clock signal; and a second clock signal generator for generating a second clock signal having a period N (N being an integer of 2 or more) times as long as the period of said first clock signal, wherein:

said A/D converter sequentially samples said input waveform signal and converts sampled values into consecutive trains of digital data synchronously with said first clock signal, dividing each train of the digital data into at least the upper and lower sub-data sets, and outputting each of said trains, said first latch updates the contents by the upper sub-data set from said A/D converter at a clock timing of said first clock signal, said second latch updates the contents by the lower sub-data set from said A/D converter at a clock timing of said first clock signal, and said memory stores the upper and lower sub-data sets stored in said first and second comparators at a clock timing of said second clock signal.

8. An oscilloscope for detecting and displaying a peak value of an input waveform signal, comprising:

an A/D converter for sequentially sampling the input waveform signal and converting respective sampled values into consecutive trains of digital data;

a first memory for storing said converted digital data, dividing each train of said converted digital data into at least two groups, and outputting at least an upper sub-data set and a lower sub-data set;

a peak value detector for detecting digital data having a peak value of the waveform signal inputted in a predetermined time in accordance with at least said upper and lower sub-data sets read from said first memory, and outputting said digital data having the peak value after a lapse of each said predetermined time; and a display unit for displaying said digital data outputted from the peak value detector, wherein said peak value detector including:

a first comparator for comparing an upper sub-data set from said first memory with an upper sub-data set stored in a first latch and having a peak value among the previous upper sub-data sets to judge which upper sub-data set has a peak value, and outputting a judgement result;

the first latch whose contents are updated by said upper sub-data set from said A/D converter if the judgement result by said first comparator indicates a first state that said upper sub-data set from said first memory has a peak value;

a second comparator for comparing a lower sub-data set from said first memory with a lower sub-data set stored in a second latch to judge which lower sub-data set has a peak value, and outputting a judgement result;

the second latch whose contents are updated by said lower sub-data set from said A/D converter in accordance with the judgement results by said first and second comparators;

a second memory for storing the upper and lower sub-data sets in said first and second comparators after each said predetermined time lapse, as digital data having a peak value of the waveform signal inputted during said predetermined time; and means for reading said digital data from said second memory and supplying said digital data to said display unit.

9. An oscilloscope according to claim 8, further comprising:

a first clock signal generator for generating a first clock signal; and a second clock signal generator for generating a second clock signal having a period equal to said predetermined time and N (N is an integer of 2 or larger) times as long as the period of said first clock signal, wherein:

said A/D converter sequentially samples said input waveform signal and converts sampled values into consecutive trains of digital data synchronously with said first clock signal;

said first latch updates the contents by the upper sub-data set from said A/D converter at a clock timing of said first clock signal;

said second latch updates the contents by the lower sub-data set from said A/D converter at a clock timing of said first clock signal; and said second memory stores the upper and lower sub-data sets stored in said first and second comparators at a clock timing of said second clock signal.

10. A method of detecting a peak value of a waveform signal continuously input during a predetermined time period, said method comprising the steps of:

a) sequentially sampling said waveform signal continuously input during the predetermined time period and converting respective sampled values of said continuously input waveform signal into consecutive trains of n-bit digital data (n being an integer of 2 or more);

b) dividing each train of said converted n-bit digital data into at least two groups of data having an upper sub-data set and a lower sub-data set;

c) supplying said upper sub-data set to a first comparator and a first latch circuit, respectively, and said lower sub-data set to a second comparator and a second latch circuit, respectively;

d) comparing the upper sub-data set input to said first comparator with a previous upper sub-data set stored into said first latch circuit, so that the upper sub-data set having a peak value is detected in said first comparator;

e) updating the contents of said first latch circuit when said upper sub-data set having the peak value is detected in said first comparator;

f) comparing the lower sub-data set input to said second comparator with a previous lower sub-data set stored into said second latch circuit, so that the lower sub-data set having a peak value is detected in said second comparator, the output of said second comparator being controlled by the output of said first comparator;

g) updating the contents of said second latch circuit in response to said output of said second comparator; and h) outputting digital data of said upper and lower sub-data sets from said first and second latch circuits.

11. A peak value detecting method according to claim 10, comprising the further steps of:

outputting digital data of said upper and lower sub-data sets from said first and second latch circuits respectively; and storing said digital data in a memory, after the predetermined time period.

12. A peak value detecting apparatus for detecting a peak value of an input waveform signal, comprising:

an input terminal for supplying said input waveform signal;

an A/D converter, connected to said input terminal, for sequentially sampling said input waveform signal, converting respective sampled values into consecutive trains of digital data and dividing each of said trains of said digital data into at least two groups of data having an upper sub-data set and a lower sub-data set;

first and a second latch circuits, coupled with said A/D converter means, for storing said upper and lower sub-data sets, respectively;

a first comparator, coupled with said A/D converter, for comparing said upper sub-data set output from said A/D converter with a previous upper sub-data set stored in said first latch circuit, the output of said first comparator being supplied to said first latch circuit, and for updating the contents of said first latch circuit when the upper sub-data set having a peak value is detected in said first comparator;

a second comparator, coupled with said A/D converter, for comparing said lower sub-data set output from said A/D converter with a previous lower sub-data set stored in said second latch circuit, the output of said second comparator being controlled by the output of said first comparator and supplied to said second latch circuit, and for updating the contents of said second latch circuit, and control means, coupled with said A/D converter, first and second latch circuits, and first and second comparators, for controlling the timing of operation thereof, whereby the digital data of said upper and lower sub-data sets from said first and second latch circuits is detected as the digital data having peak values.

13. A peak value detecting apparatus according to claim 12, further comprising:

a first clock signal generator for generating a first clock signal; and a second clock signal generator for generating a second clock signal having a period equal to said predetermined time and N (N being an integer of 2 or more) times as long as the period of said first clock signal, wherein:

said A/D converter sequentially samples said input waveform signal and converts sampled values into consecutive trains of digital data synchronously with said first clock signal, dividing each train of the digital data into at least the upper and lower sub-data sets, and outputting each of said trains, said first latch updates the contents thereof by the upper sub-data set from said A/D converter at a clock timing of said first clock signal, said second latch updates the contents thereof by the lower sub-data set from said A/D converter at a clock timing of said first clock signal, and said memory stores the upper and lower sub-data sets stored in said first and second comparators at a clock timing of said second clock signal.

14. A peak value detecting apparatus according to claim 12, wherein:

the contents of said second latch are updated by said lower sub-data set from said A/D converter when a judgement result by said first comparator indicates that the upper sub-data set from said A/D converter and the upper sub-data set stored in said first latch circuit have the same value and when a judgement result by said second comparator indicates a lower sub-data set having a peak value; and the contents of said second latch circuit are updated by said lower sub-data set from said A/D converter when a judgement result by said first comparator indicates said first state, irrespective of a judgement result of said second comparator.

15. A peak value detecting apparatus according to claim 12, further comprising a memory coupled with said first and second latch circuits, the digital data of said upper and lower sub-sets from said first and second latch circuits being stored into said memory.

16. An oscilloscope for detecting and displaying a peak value of an input waveform signal, comprising:

an A/D converter for sequentially sampling the input waveform signal and converting respective sampled values into consecutive trains of digital data;

a first memory for storing said converted digital data, dividing each train of said converted digital data into at least two groups of data having at least an upper sub-data set and a lower sub-data set;

a peak value detector for detecting digital data having a peak value of the waveform signal input in a predetermined time in accordance with said upper and lower sub-data sets read from said first memory, and outputting said digital data having the peak value after a lapse of each said predetermined time; and a display unit for displaying said digital data output from the peak value detector;

wherein said peak value detector includes:

first and a second latch circuits coupled with said first memory, for storing said upper and lower sub-data sets, respectively, a first comparator coupled with said first memory, for comparing said upper sub-data set output from said first memory with the previous upper sub-data set stored in said first latch circuit, the output of said first comparator being supplied to said first latch circuit and updating the contents of said first latch circuit when the upper sub-data set having a peak value is detected in said first comparator, a second comparator coupled with said first memory, for comparing said lower sub-data set output from said first memory with the previous lower sub-data set stored into said second latch circuit, the output of said second comparator being controlled by the output of said first comparator and supplied to said second latch circuit, and for updating the contents of said second latch circuit;

a second memory for storing the upper and lower sub-data sets from said first and second latch circuits after each said predetermined time lapse, as digital data having a peak value of the waveform signal input during said predetermined time, and means for reading said digital data from said second memory and supplying said digital data to said display unit.

17. An oscilloscope according to claim 16, further comprising:

a first clock signal generator for generating a first clock signal; and a second clock signal generator for generating a second clock signal having a period equal to said predetermined time and N (N being an integer of 2 or more) times as long as the period of said first clock signal, wherein:

said A/D converter sequentially samples said input waveform signal and converts sampled values into consecutive trains of digital data synchronously with said first clock signal, said first latch updates the contents thereof by the upper sub-data set from said A/D converter at a clock timing of said first clock signal, said second latch updates the contents thereof by the lower sub-data set from said A/D converter at a clock timing of said first clock signal, and said second memory stores the upper and lower sub-data sets stored in said first and second comparators at a clock timing of said clock signal.

\* \* \* \* \*